(12) United States Patent
You et al.

(10) Patent No.: US 12,191,142 B2
(45) Date of Patent: Jan. 7, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Anhui (CN)

(72) Inventors: Kang You, Hefei (CN); Jie Bai, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 375 days.

(21) Appl. No.: 17/573,784

(22) Filed: Jan. 12, 2022

(65) Prior Publication Data

US 2023/0024779 A1 Jan. 26, 2023

Related U.S. Application Data

(63) Continuation of application No. PCT/CN2021/117285, filed on Sep. 8, 2021.

(30) Foreign Application Priority Data

Jul. 22, 2021 (CN) .............................. 202110833035

(51) Int. Cl.
*H01L 21/02* (2006.01)
*H01L 21/311* (2006.01)
(Continued)

(52) U.S. Cl.
CPC .. *H01L 21/02238* (2013.01); *H01L 21/31111* (2013.01); *H01L 27/092* (2013.01);
(Continued)

(58) Field of Classification Search
CPC ......... H01L 21/823807; H01L 27/1203; H01L 27/092; H01L 21/823412; H01L 21/02532
See application file for complete search history.

(56) References Cited

U.S. PATENT DOCUMENTS

| 7,439,110 B2 | 10/2008 | Cheng |
| 2003/0080361 A1* | 5/2003 | Murthy ............... H01L 29/6656 257/E29.267 |

(Continued)

FOREIGN PATENT DOCUMENTS

| CN | 101075585 A | 11/2007 |
| CN | 101136370 A | 3/2008 |

(Continued)

*Primary Examiner* — John A Bodnar
(74) *Attorney, Agent, or Firm* — Kilpatrick Townsend & Stockton LLP (57) ABSTRACT

A semiconductor structure and a method for manufacturing the semiconductor structure are provided. The method includes: providing a substrate including a core NMOS area, a core PMOS area and a peripheral NMOS area; performing oxidation treatment on the substrate in the core PMOS area to convert a thickness of a part of the substrate in the core PMOS area into an oxide layer; removing the oxide layer; forming a first semiconductor layer on the remaining substrate in the core PMOS area; forming a gate dielectric layer located on the first semiconductor layer and on the substrate in the core NMOS area and the peripheral NMOS area; and forming a gate on the gate dielectric layer.

11 Claims, 11 Drawing Sheets

(51) Int. Cl.
*H01L 27/092* (2006.01)
*H01L 21/8238* (2006.01)

(52) U.S. Cl.
CPC ............... *H01L 21/823828* (2013.01); *H01L 21/823857* (2013.01)

(56) References Cited

U.S. PATENT DOCUMENTS

| | | | |
|---|---|---|---|
| 2004/0079993 A1* | 4/2004 | Ning | H01L 27/1203 257/E21.703 |
| 2007/0218654 A1* | 9/2007 | Spencer | H01L 29/7848 257/E21.426 |
| 2007/0269963 A1 | 11/2007 | Cheng | |
| 2008/0224216 A1 | 9/2008 | Cheng | |
| 2010/0065898 A1 | 3/2010 | Choi | |
| 2011/0070702 A1* | 3/2011 | Chien | H01L 21/28194 257/E21.639 |

FOREIGN PATENT DOCUMENTS

| | | |
|---|---|---|
| CN | 102226989 A | 10/2011 |
| CN | 103065963 B | 8/2015 |
| CN | 105632890 A | 6/2016 |
| CN | 106816368 A | 6/2017 |

\* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2021/117285, filed on Sep. 8, 2021, which claims priority to Chinese Patent Application No. 202110833035.3, filed on Jul. 22, 2021 and entitled "Semiconductor Structure and Method for Manufacturing Semiconductor Structure". The disclosures of International Patent Application No. PCT/CN2021/117285 and Chinese Patent Application No. 202110833035.3 are incorporated by reference herein in their entireties.

BACKGROUND

A semiconductor structure may be divided into different areas according to different functions. For example, a semiconductor structure is divided into a core area, a peripheral area, an array area, etc.

The core area is an area for forming a core circuit, and generally includes a core PMOS (P-channel Metal Oxide Semiconductor) transistor, a core NMOS (N-channel Metal Oxide Semiconductor) transistor and corresponding circuits for controlling the corresponding transistors. The peripheral area is an area for forming a peripheral circuit, and generally includes a peripheral PMOS transistor, a peripheral NMOS transistor and corresponding circuits for controlling the corresponding transistors.

According to the functional requirements of different semiconductor structures, the structures of the transistors formed in the core area and the peripheral area are also different.

SUMMARY

The embodiments of the disclosure relate to the semiconductor field, and particularly relate to a semiconductor structure and a method for manufacturing the semiconductor structure.

According to a first aspect of the embodiments of the disclosure, there is provided a method for manufacturing a semiconductor structure, including: providing a substrate including a core N-channel Metal Oxide Semiconductor (NMOS) area, a core P-channel Metal Oxide Semiconductor (PMOS) area and a peripheral NMOS area; performing oxidation treatment on the substrate in the core PMOS area to convert a part of a thickness of the substrate in the core PMOS area into an oxide layer; removing the oxide layer; forming a first semiconductor layer on the remaining substrate in the core PMOS area, in which a hole mobility in the first semiconductor layer is greater than a hole mobility in the substrate in the core PMOS area; forming a gate dielectric layer located on the first semiconductor layer and on the substrate in the core NMOS area and the peripheral NMOS area; and forming a gate on the gate dielectric layer.

According to a second aspect of the embodiments of the disclosure, there is further provided a semiconductor structure, including: a substrate including a core NMOS area, a core PMOS area and a peripheral NMOS area, in which in a direction perpendicular to a surface of the substrate, a thickness of the substrate in the core PMOS area is less than a thickness of the substrate in the core NMOS area; a first semiconductor layer located on the surface of the substrate in the PMOS area, in which a hole mobility in the first semiconductor layer is greater than a hole mobility in the substrate in the core PMOS area; a gate dielectric layer located on the substrate in the core NMOS area and the peripheral NMOS area and on the first semiconductor layer in the PMOS area; and a gate located on the gate dielectric layer.

BRIEF DESCRIPTION OF THE DRAWINGS

One or more embodiments are exemplarily illustrated by the corresponding figures of the accompanying drawings. The figures in the accompanying drawings do not constitute a scale limitation unless otherwise indicated.

DETAILED DESCRIPTION

In order to achieve the functional requirements of a core PMOS area, in some embodiments, a first conductive layer is formed on the surface of the substrate in the core PMOS area. In some embodiments, the first conductive layer serves as a part of a work function layer to play a role in adjusting carriers. However, the formation of the first conductive layer will cause a height difference between the core PMOS area and other areas, thereby increasing the complexity of the subsequent processes. Taking polishing as an example, in a polishing process, there may be a case where the core PMOS area has been polished, but there are still some film layers that need to be removed in other areas, and other steps still need to be taken to remove this part of the film layers that need to be removed.

The embodiments of the disclosure provide a method for manufacturing a semiconductor structure, and the semiconductor structure. The height difference between the core PMOS area and the core NMOS area is reduced by reducing the height of the substrate in the core PMOS area.

In order to make the objectives, technical solutions and advantages of the embodiments of the disclosure clearer, the embodiments of the disclosure will be described in detail below with reference to the accompanying drawings. However, a person of ordinary skill in the art can understand that in the embodiments of the disclosure, many technical details are provided for readers to better understand the disclosure. However, the technical solution claimed in the disclosure can also be implemented without these technical details and various changes and modifications based on the following embodiments.

Figure 1:
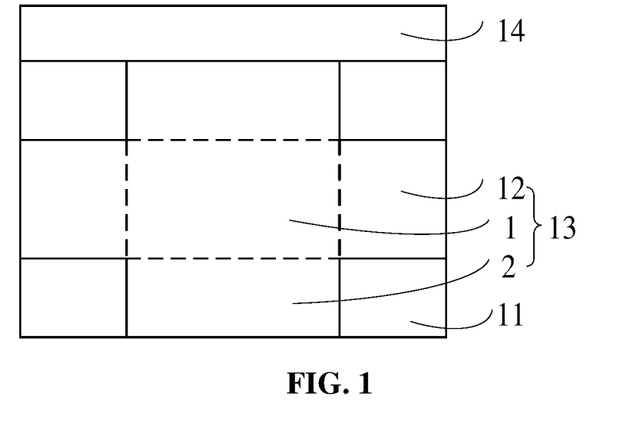
FIG. 1 is a schematic cross-sectional structural diagram corresponding to a semiconductor structure.

FIG. 1 is a schematic cross-sectional structural diagram corresponding to a semiconductor structure.

Referring to FIG. 1, in some embodiments, a semiconductor structure may include array areas 11. A switch control (SWC) module 1 is disposed among four array areas 11, a sub word-line driver (SWD) 2 is disposed between two adjacent array areas 11 along an extension direction of a word line, and a sense amplify (SA) 12 is disposed between two array areas 11 along an extension direction of a bit line. A core area 13 includes the SWC module 1, the SWD 2 and the SA 12, and a peripheral area 14 is located at the periphery of the core area 13 and the array area 11.

Specifically, the array area 11 is an area where a storage array is formed, and the storage array may include word lines, bit lines and storage capacitors. The SA 12 is a sense amplification module, and the sense amplification module may include a sense amplifier and a circuit structure for controlling the sense amplifier. The core area 13 is a core circuit area, and the core circuit area may include a core NMOS transistor and a core PMOS transistor. The peripheral area 14 is a peripheral circuit area, and the peripheral circuit area may include a peripheral NMOS transistor and a peripheral PMOS transistor.

FIG. 2 to FIG. 21 are schematic structural diagrams corresponding to the steps in a method for manufacturing a semiconductor structure provided in the embodiments of the disclosure.

Figure 2:
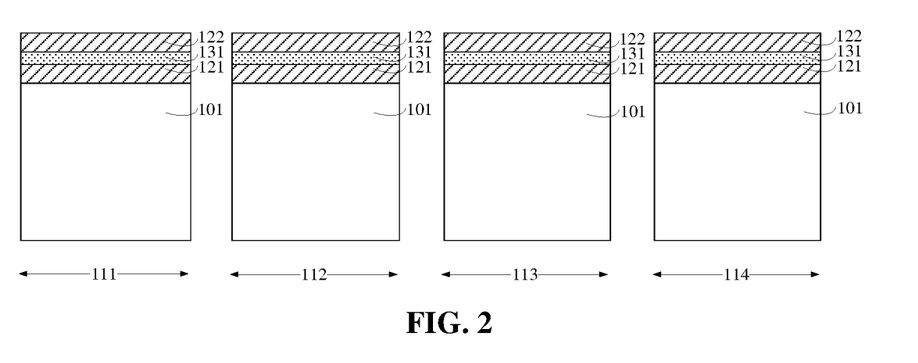
FIG. 2 to FIG. 21 are schematic structural diagrams corresponding to the steps in a method for manufacturing a semiconductor structure provided in the embodiments of the disclosure.

Referring to FIG. 2, a substrate 101 including a core NMOS area 111, a core PMOS area 112 and a peripheral NMOS area 113 is provided.

In some embodiments, the substrate 101 may be a silicon substrate or a silicon-on-insulator substrate. In addition, the surfaces of the core NMOS area 111, the core PMOS area 112 and the peripheral NMOS area 113 are flush with each other.

In some embodiments, the substrate 101 may further include a peripheral PMOS area 114.

The core NMOS area 111 is an area where a core NMOS transistor is to be formed, the core PMOS area 112 is an area where a core PMOS transistor is to be formed, the peripheral NMOS area 113 is an area where a peripheral NMOS transistor is to be formed, and the peripheral PMOS area 114 is an area where a peripheral PMOS transistor is to be formed.

It should be noted that for ease of viewing, the core NMOS area 111, the core PMOS area 112, the peripheral NMOS area 113 and the peripheral PMOS area 114 are drawn in adjacent positions in the figures, but the actual positions of the areas are subject to the actual production process.

The core area 13 (referring to FIG. 1) includes the core NMOS area 111 and the core PMOS area 112, and the peripheral area 14 (referring to FIG. 1) includes the peripheral NMOS area 113 and the peripheral PMOS area 114.

Referring to FIG. 2 to FIG. 7, oxidation treatment is performed on the substrate 101 in the core PMOS area 112 to convert a part of a thickness of the substrate 101 in the core PMOS area 112 into an oxide layer 141.

By forming the oxide layer 141 and controlling the thickness of the oxide layer 141 in a direction perpendicular to the surface of the substrate 101, the thickness of the substrate 101 to be removed from the core PMOS area 112 is controlled. Moreover, directly removing the substrate 101 in the core PMOS area 112 by dry etching may lose crystal lattices. By forming the oxide layer 141 and then removing the oxide layer 141 by wet etching, the lattice damage can be reduced.

The method for forming the oxide layer 141 in some embodiments will be described in detail below with reference to the accompanying drawings.

In some embodiments, referring to FIG. 2, before the oxide layer is formed, a first barrier layer 121 may also be formed on the surface of the substrate 101 in the core PMOS area 112.

The first barrier layer 121 is used to slow down the oxidation rate when a part of the substrate 101 in the core PMOS area 112 is oxidized subsequently, thereby controlling the thickness of the oxide layer.

In some embodiments, the material of the first barrier layer 121 may be silicon oxide.

In some embodiments, in the process step of forming the first barrier layer 121, the first barrier layer 121 may also be formed on the surface of the substrate 101 in the core NMOS area 111 and the peripheral NMOS area 113.

In some embodiments, the first barrier layer 121 is also used to play a role in stopping etching in the subsequent process of etching the second barrier layer 131.

Continuing to refer to FIG. 2, in some embodiments, the second barrier layer 131 may also be formed on the surface of the first barrier layer 121 in the core NMOS area 111 and the peripheral NMOS area 113, and the material of the second barrier layer 131 is different from the material of the first barrier layer 121.

The second barrier layer 131 is used to play a role in stopping etching in the subsequent process of etching a third barrier layer 122. The second barrier layer 131 is also used to protect the substrate 101 in the core NMOS area 111 and the peripheral NMOS area 113 from being oxidized in the subsequent process of oxidizing the substrate 101 in the core NMOS area 111. In some embodiments, the second barrier layer 131 is also used to protect the first barrier layer 121 in the core NMOS area 111, the peripheral NMOS area 113 and the peripheral PMOS area 114 from being etched in the subsequent process of etching the oxide layer.

In some embodiments, the material of the second barrier layer 131 may be silicon nitride.

Continuing to refer to FIG. 2, in some embodiments, the third barrier layer 122 may also be formed on the surface of the second barrier layer 131 in the core NMOS area 111, the core PMOS area 112, the peripheral NMOS area 113 and the peripheral PMOS area 114.

The third barrier layer 122 is used to protect the second barrier layer 131 in the core NMOS area 111, the peripheral NMOS area 113 and the peripheral PMOS area 114 from being etched away when the core PMOS area 112 is etched subsequently.

In some embodiments, the material of the third barrier layer 122 may be the same as the material of the first barrier layer 121, and the material may be silicon oxide.

After the oxide layer is formed and before the oxide layer is removed, the method further includes: removing the first barrier layer 121 in the core PMOS area 112.

Figure 3:
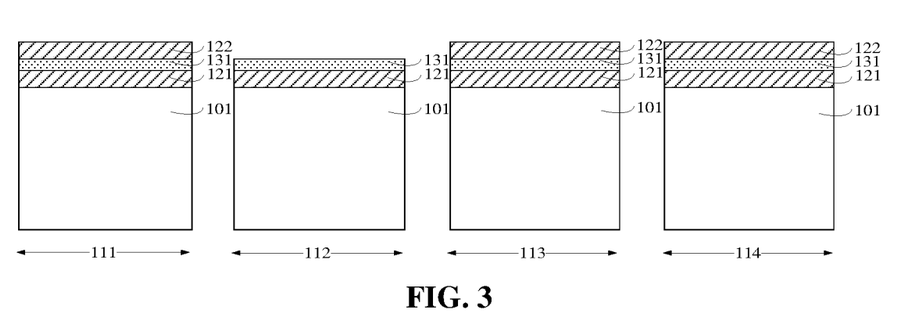

Referring to FIG. 3, the third barrier layer 122 in the core PMOS area 112 is removed until the surface of the second barrier layer 131 in the core area is exposed.

In some embodiments, the third barrier layer 122 in the core PMOS area 112 may be removed by means of selective wet etching. In another embodiment, the third barrier layer 122 in the core PMOS area 112 may also be removed by means of mask etching.

Figure 4:
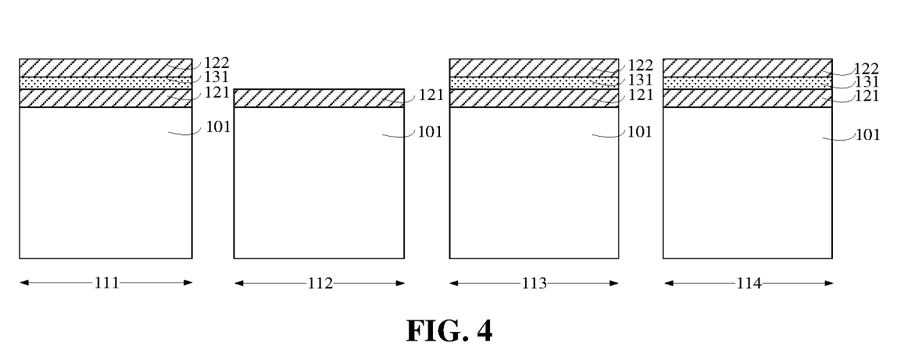

Referring to FIG. 4, the second barrier layer 131 in the core PMOS area 112 is removed until the surface of the first barrier layer 121 in the core area is exposed.

The second barrier layer 131 in the core PMOS area 112 is removed by a wet etching process. In the wet etching process, since the core NMOS area 111, the peripheral NMOS area 113 and the peripheral PMOS area 114 still retain the third barrier layer 122, the third barrier layer 122 protects the second barrier layer 131 in the core NMOS area 111, the peripheral NMOS area 113 and the peripheral PMOS area 114 in the wet etching process.

Figure 5:
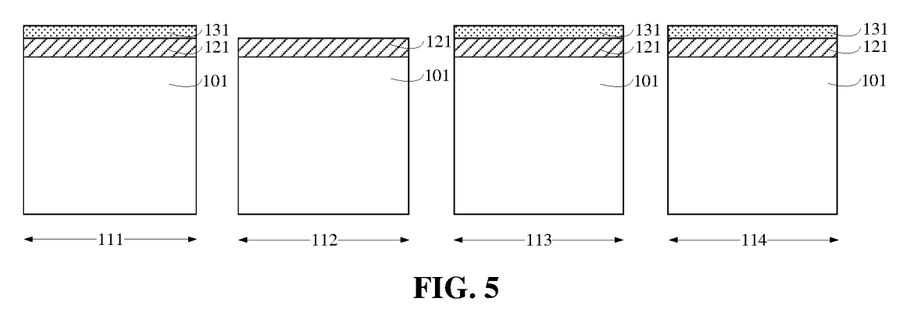

Referring to FIG. 5, the third barrier layer 122 (referring to FIG. 4) in the core NMOS area 111, the peripheral NMOS area 113 and the peripheral PMOS area 114 is removed until the surface of the second barrier layer 131 is exposed.

In some embodiments, the third barrier layer 122 (referring to FIG. 4) in the core NMOS area 111, the peripheral NMOS area 113 and the peripheral PMOS area 114 is removed by a wet etching process. In some other embodiments, the third barrier layer 122 (referring to FIG. 4) in the core NMOS area 111, the peripheral NMOS area 113 and the peripheral PMOS area 114 may also be removed by means of polishing.

Figure 6:
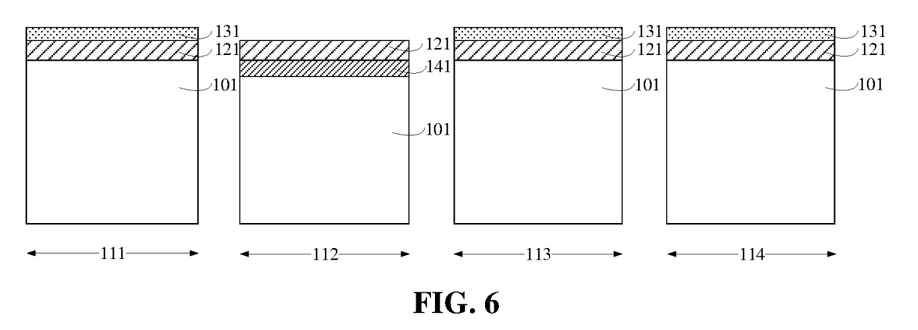

Referring to FIG. 6, oxidation treatment is performed on the substrate 101 in the core PMOS area 112 to convert a part of a thickness of the substrate 101 in the core PMOS area 112 into an oxide layer 141.

In some embodiments, in a direction perpendicular to the surface of the substrate 101, a thickness of the oxide layer 141 ranges from 10 Å to 200 Å. It can be understood that the thickness of the oxide layer 141 can be adjusted according to actual requirements.

In some embodiments, methods for the oxidation treatment may include a thermal oxidation method, an in-situ water vapor generation oxidation method or an atomic group oxidation method.

Taking the thermal oxidation method as an example, in some embodiments, the oxidizing gas is introduced into a heating furnace, and at a high temperature of 900° C. to 1200° C., the oxidizing gas diffuses to the substrate 101 in the core PMOS area 112 and chemically reacts with the substrate 101, thereby forming the oxide layer 141.

Figure 7:
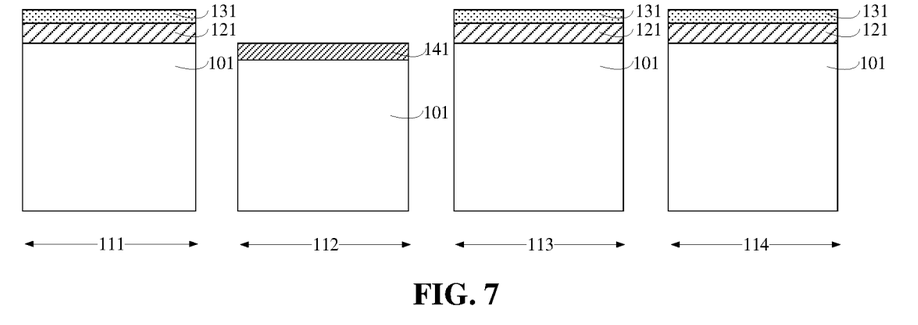

Referring to FIG. 7, the first barrier layer 121 in the core PMOS area 112 is removed until the surface of the oxide layer 141 is exposed.

In some embodiments, the first barrier layer 121 in the core PMOS area 112 is removed by means of wet etching.

Figure 8:
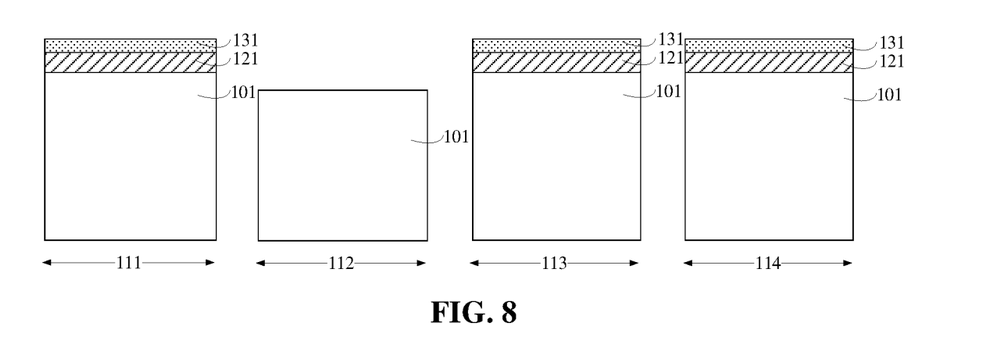

Referring to FIG. 8, the oxide layer 141 (referring to FIG. 7) in the core PMOS area 112 is removed until the surface of the substrate 101 in the core PMOS area 112 is exposed.

In some embodiments, the oxide layer 141 (referring to FIG. 7) in the core PMOS area 112 is removed by means of wet etching.

The height of the surface of the substrate 101 in the core PMOS area 112 is reduced by removing the oxide layer 141 (referring to FIG. 7).

In some embodiments, the material of the first barrier layer is the same as the material of the oxide layer, and the first barrier layer and the oxide layer can be removed simultaneously.

Figure 9:
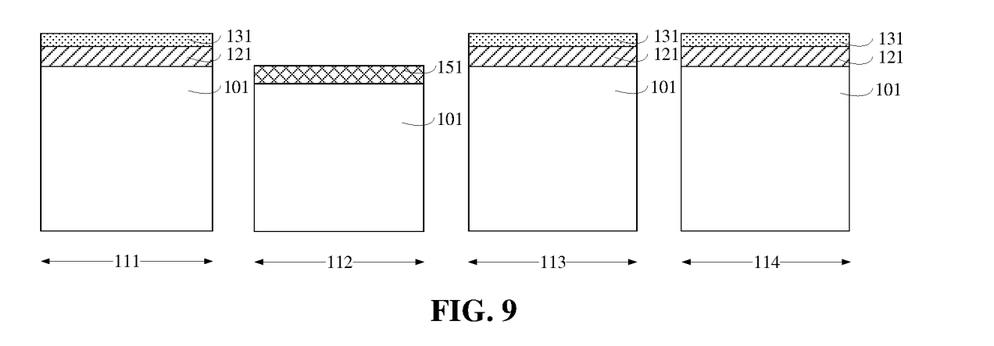

Referring to FIG. 9, a first semiconductor layer 151 is formed on the remaining substrate 101 in the core PMOS area 112, and a hole mobility in the first semiconductor layer 151 is greater than a hole mobility in the substrate 101 in the core PMOS area 112.

In some embodiments, the first semiconductor layer 151 serves as a work function layer in the core PMOS area 112 to play a role in adjusting carriers.

In a direction perpendicular to the surface of the substrate 101, the height of the top surface of the first semiconductor layer 151 in the core PMOS area 112 is greater than or equal to the height of the top surface of the substrate 101 in the core NMOS area 111, the peripheral NMOS area 113 and the peripheral PMOS area 114.

In some embodiments, the first semiconductor layer 151 is formed by a selective epitaxial process. The material of the first semiconductor layer 151 includes silicon germanium or germanium.

In some other embodiments, a first semiconductor layer may also be deposited in the core NMOS area, the core PMOS area, the peripheral NMOS area and the peripheral PMOS area, and then, the first semiconductor layer in the core NMOS area, the peripheral NMOS area and the peripheral PMOS area is removed.

When the material of the first semiconductor layer 151 is silicon germanium, the mass percentage concentration of the germanium element ranges from 5% to 50%.

It can be understood that the higher the mass percentage concentration of the germanium element, the higher the hole mobility of the corresponding first semiconductor layer 151, and the worse the stress resistance of the corresponding first semiconductor layer 151, so that the stress resistance of the first semiconductor layer 151 is generally improved by increasing the thickness of the first semiconductor layer 151 in a direction perpendicular to the surface of the substrate 101.

In some embodiments, the thickness of the first semiconductor layer 151 in a direction perpendicular to the surface of the substrate 101 ranges from 30 Å to 100 Å.

In some embodiments, the first semiconductor layer 151 serves as a part of the work function layer in the core PMOS area 112, thereby realizing the function of the core PMOS area 112.

Figure 10:
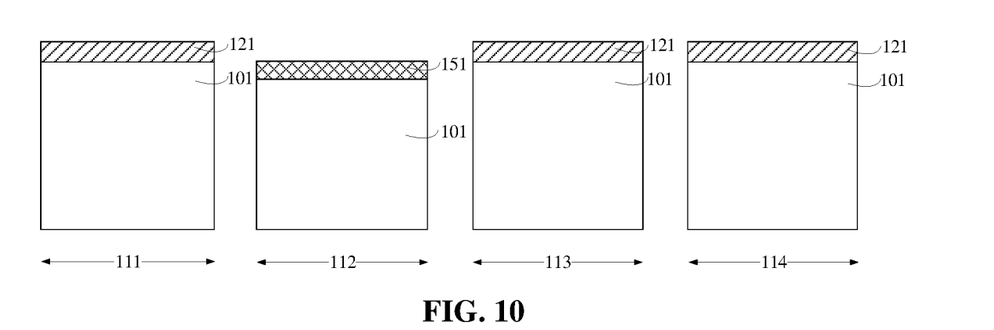

Referring to FIG. 10, after the first semiconductor layer 151 is formed, the second barrier layer 131 (referring to FIG. 9) is removed, and the first barrier layer 121 in the core NMOS area 111 and the peripheral NMOS area 113 is retained.

In some embodiments, the second barrier layer 131 (referring to FIG. 9) may be removed by means of polishing. In some other embodiments, the second barrier layer 131 (referring to FIG. 9) may be removed by means of wet etching.

In some embodiments, the first barrier layer 121 in the peripheral PMOS area 114 is also retained.

The first barrier layer 121 is used to protect the substrate 101 in the core NMOS area 111, the peripheral NMOS area 113 and the peripheral PMOS area 114 from being oxidized in the subsequent process of forming the protective layer.

Figure 11:
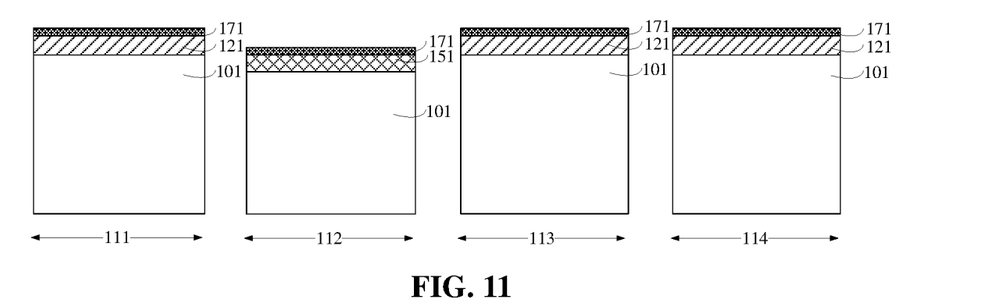
Figure 12:
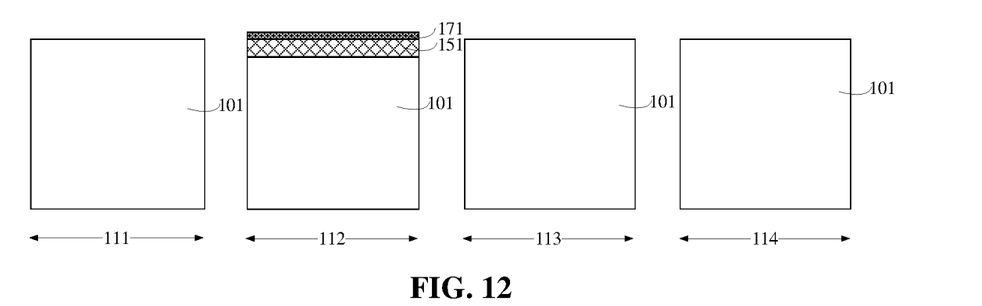
Figure 13:
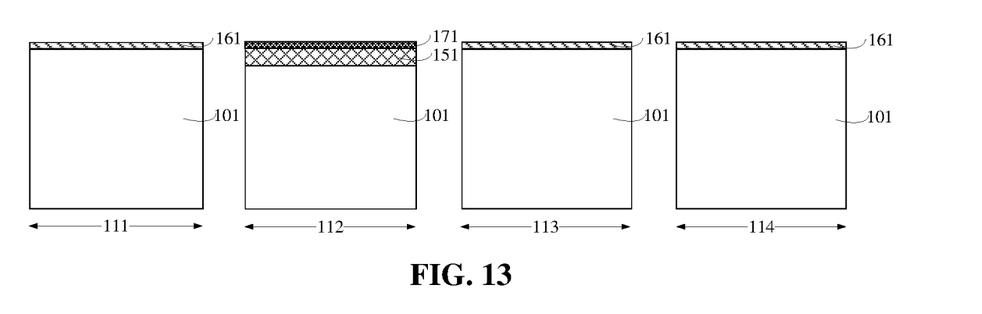

Referring to FIG. 11 to FIG. 13, after the first semiconductor layer 151 is formed, the method may further include the following operation. A second semiconductor layer 161 is formed on the surface of the substrate 101 in the core NMOS area 111, the peripheral NMOS area 113 and the peripheral PMOS area 114 by a selective epitaxial process, and the material of the second semiconductor layer 161 is the same as the material of the substrate 101.

The second semiconductor layer 161 is used to further reduce the height difference between the core NMOS area 111 and the core PMOS area 112.

In some embodiments, in a direction perpendicular to the surface of the substrate 101, the height of the top surface of the second semiconductor layer 161 is less than or equal to the height of the top surface of the first semiconductor layer 151.

The steps of forming the second semiconductor layer 161 in some embodiments will be described in detail below with reference to FIG. 11 to FIG. 13.

Referring to FIG. 11, a protective layer 171 is formed on the surface of the first semiconductor layer 151 by a chemical oxidation method.

The protective layer 171 is used to subsequently prevent the formation of the second semiconductor layer on the surface of the first semiconductor layer 151 in the core PMOS area 112.

The protective layer 171 also covers the surface of the first barrier layer 121 in the core NMOS area 111, the peripheral NMOS area 113 and the peripheral PMOS area 114.

In some embodiments, oxidation is performed by hydrogen peroxide or ozone reagent, and in a direction perpendicular to the surface of the substrate 101, the thickness of the protective layer 171 is less than or equal to 2 nm.

The thickness less than or equal to 2 nm of the protective layer 171 avoids excessive consumption of the first semiconductor layer 151, which results in reduction of the efficiency of the first semiconductor layer 151 in the core PMOS area 112 in adjusting carriers.

In some embodiments, the material of the protective layer 171 may be silicon oxide.

Referring to FIG. 12, the protective layer 171 and the first barrier layer 121 (referring to FIG. 11) in the core NMOS area 111, the peripheral NMOS area 113 and the peripheral PMOS area 114 are removed until the top surface of the substrate 101 is exposed.

In some embodiments, the protective layer 171 and the first barrier layer 121 (referring to FIG. 11) in each of the core NMOS area 111, the peripheral NMOS area 113 and the peripheral PMOS area 114 may be removed by means of wet etching.

In some embodiments, since the first barrier layer 121 (referring to FIG. 11) is subjected to process steps such as etching in the previous production processes, part of the structure of the first barrier layer 121 (referring to FIG. 11) is damaged, and thus, the first barrier layer 121 (referring to FIG. 11) is removed.

Referring to FIG. 13, the second semiconductor layer 161 is formed on the top surface of the substrate 101 in the core NMOS area 111, the peripheral NMOS area 113 and the peripheral PMOS area 114.

In some embodiments, the second semiconductor layer 161 is formed by means of selective epitaxial growth.

In some other embodiments, the second semiconductor layer may not be formed on the top surface of the substrate in the core NMOS area, the peripheral NMOS area and the peripheral PMOS area. It can be understood that the second semiconductor layer may be selectively formed according to the height difference between the core NMOS area and the core PMOS area.

In some embodiments, the thickness of the second semiconductor layer 161 in a direction perpendicular to the surface of the substrate 101 ranges from 1 Å to 400 Å.

It can be understood that the thickness of the second semiconductor layer 161 in a direction perpendicular to the surface of the substrate 101 can be adjusted according to actual production requirements.

Referring to FIG. 14 to FIG. 17, a gate dielectric layer 15 is formed, and the gate dielectric layer 15 is located on the first semiconductor layer 151 and on the substrate 101 in the core NMOS area 111 and the peripheral NMOS area 113.

Figure 17:
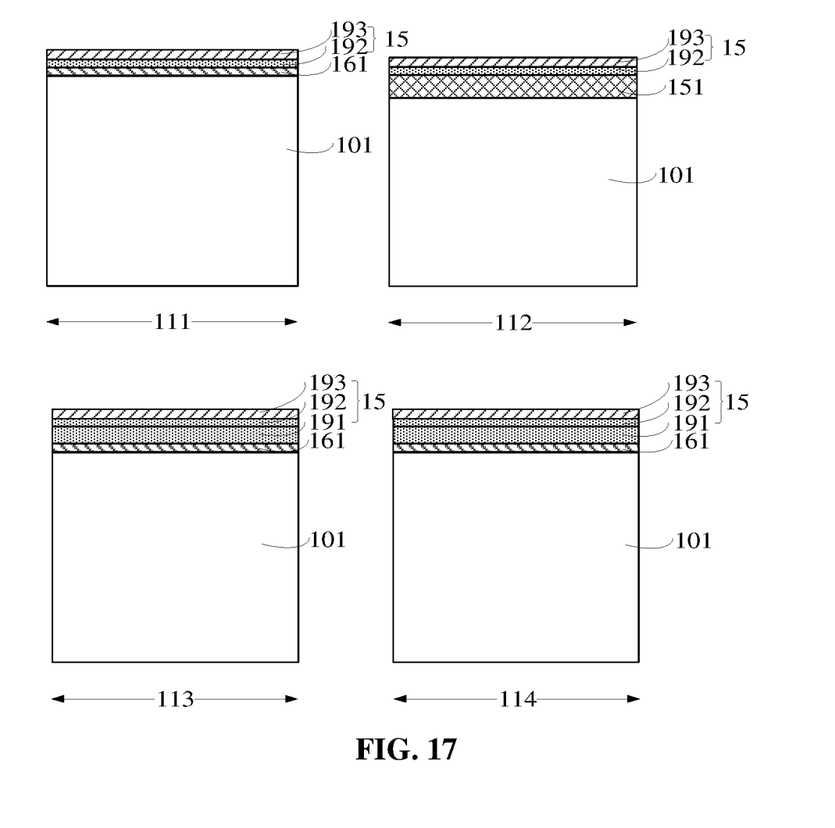

In some embodiments, in a direction perpendicular to the surface of the substrate 101, the thickness of the gate dielectric layer 15 in the core NMOS area 111 is the same as the thickness of the gate dielectric layer 15 in the core PMOS area 112, the thickness of the gate dielectric layer 15 in the peripheral NMOS area 113 is the same as the thickness of the gate dielectric layer 15 in the peripheral PMOS area 114, and the thickness of the gate dielectric layer 15 in the core NMOS area 111 is less than the thickness of the gate dielectric layer 15 in the peripheral NMOS area 113.

In some embodiments, the second semiconductor layer 161 is also formed, and the gate dielectric layer 15 is located on the surface of the second semiconductor layer 161 in each of the core NMOS area 111, the peripheral NMOS area 113 and the peripheral PMOS area 114 and on the surface of the first semiconductor layer 151 in the core PMOS area 112. In some other embodiments, the second semiconductor layer is not formed, and the gate dielectric layer is located on the surface of the substrate.

Figure 14:
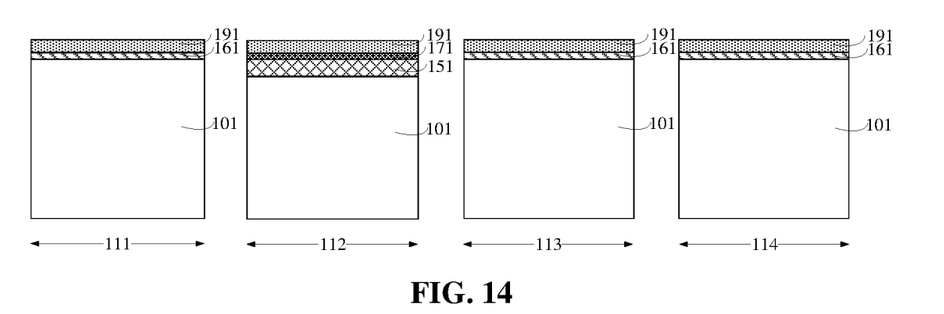

Specifically, referring to FIG. 14, a first initial gate dielectric layer 191 is formed, and the first initial gate dielectric layer 191 covers the top surface of the second semiconductor layer 161 in the core NMOS area 111, the peripheral NMOS area 113 and the peripheral PMOS area 114, and also covers the top surface of the protective layer 171 in the core PMOS area 112.

In some embodiments, the material of the first initial gate dielectric layer 191 may be silicon oxide.

In some embodiments, in a direction perpendicular to the substrate 101, the thickness of the first initial gate dielectric layer 191 ranges from 40 Å to 80 Å.

Figure 15:
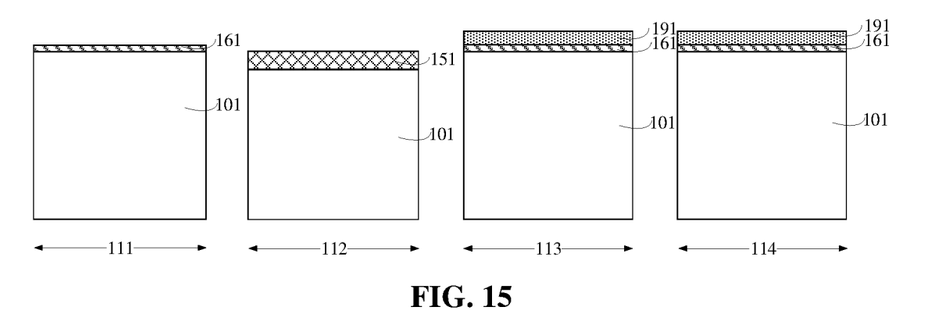

Referring to FIG. 15, the first initial gate dielectric layer 191 and the protective layer 171 (referring to FIG. 14) in the core NMOS area 111 and the core PMOS area 112 are removed until the surfaces of the second semiconductor layer 161 in the core NMOS area 111 and of the first semiconductor layer 151 in the core PMOS area 112 are exposed.

In some embodiments, the first initial gate dielectric layer 191 and the protective layer 171 (referring to FIG. 14) in the core NMOS area 111 and the core PMOS area 112 may be removed by means of mask etching.

Figure 16:
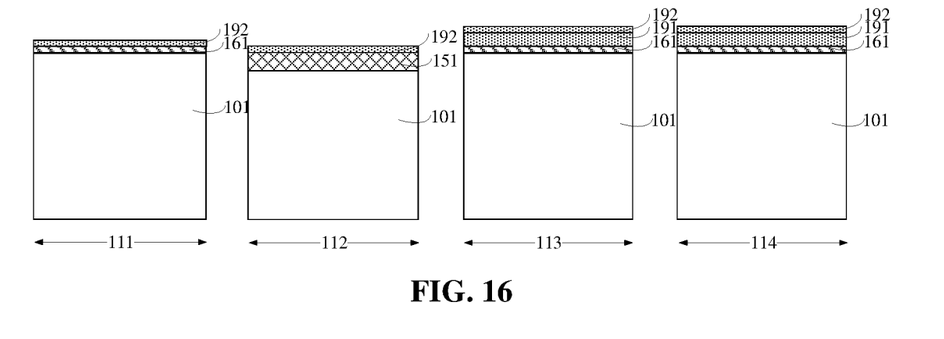

Referring to FIG. 16, a second initial gate dielectric layer 192 is formed, and the second initial gate dielectric layer 192 is located on the top surface of each of the second semiconductor layer 161 in the core NMOS area 111, the first semiconductor layer 151 in the core PMOS area 112, the first initial gate dielectric layer 191 in the peripheral NMOS area 113 and the first initial gate dielectric layer 191 in the peripheral PMOS area 114.

In a direction perpendicular to the surface of the substrate 101, the thickness of the second initial gate dielectric layer 192 is less than the thickness of the first initial gate dielectric layer 191.

In some embodiments, in a direction perpendicular to the surface of the substrate 101, the thickness of the second initial gate dielectric layer 192 ranges from 5 Å to 20 Å.

In some embodiments, the material of the first initial gate dielectric layer 191 and the material of the second initial gate dielectric layer 192 may be the same, and the both may be silicon oxide.

In some embodiments, the material of the first initial gate dielectric layer 191 is also the same as the material of the first barrier layer 121 (referring to FIG. 11), so as to reduce the types of materials and the types of etching agents in the production processes, thereby reducing the manufacturing cost and complexity of the semiconductor process.

In some embodiments, the density of the first initial gate dielectric layer 191 is higher than the density of the first barrier layer 121 (referring to FIG. 11), and the high density can reduce the current leakage and improve the charge transfer efficiency, thereby improving the performance of the semiconductor structure.

Referring to FIG. 17, a third initial gate dielectric layer 193 is formed, and the third initial gate dielectric layer 193 covers the top surface of the second initial gate dielectric layer 192.

It can be understood that the relative dielectric constant of the third initial gate dielectric layer 193 is greater than the relative dielectric constant of each of the second initial gate dielectric layer 192 and the first initial gate dielectric layer 191, and the third initial gate dielectric layer 193 is a gate dielectric layer with a high dielectric constant.

In some embodiments, the material of the third initial gate dielectric layer 193 may be silicon hafnium oxide.

In some embodiments, the second initial gate dielectric layer 192 and the third initial gate dielectric layer 193 in the core NMOS area 111 and the core PMOS area 112 together constitute the gate dielectric layer 15 in the core NMOS area 111 and the core PMOS area 112, and the first initial gate dielectric layer 191, the second initial gate dielectric layer 192 and the third initial gate dielectric layer 193 in the peripheral NMOS area 113 and the peripheral PMOS area 114 together constitute the gate dielectric layer 15 in the peripheral NMOS area 113 and the peripheral PMOS area 114.

Referring to FIG. 18 to FIG. 21, a gate 19 is formed on the gate dielectric layer 15.

Figure 21:
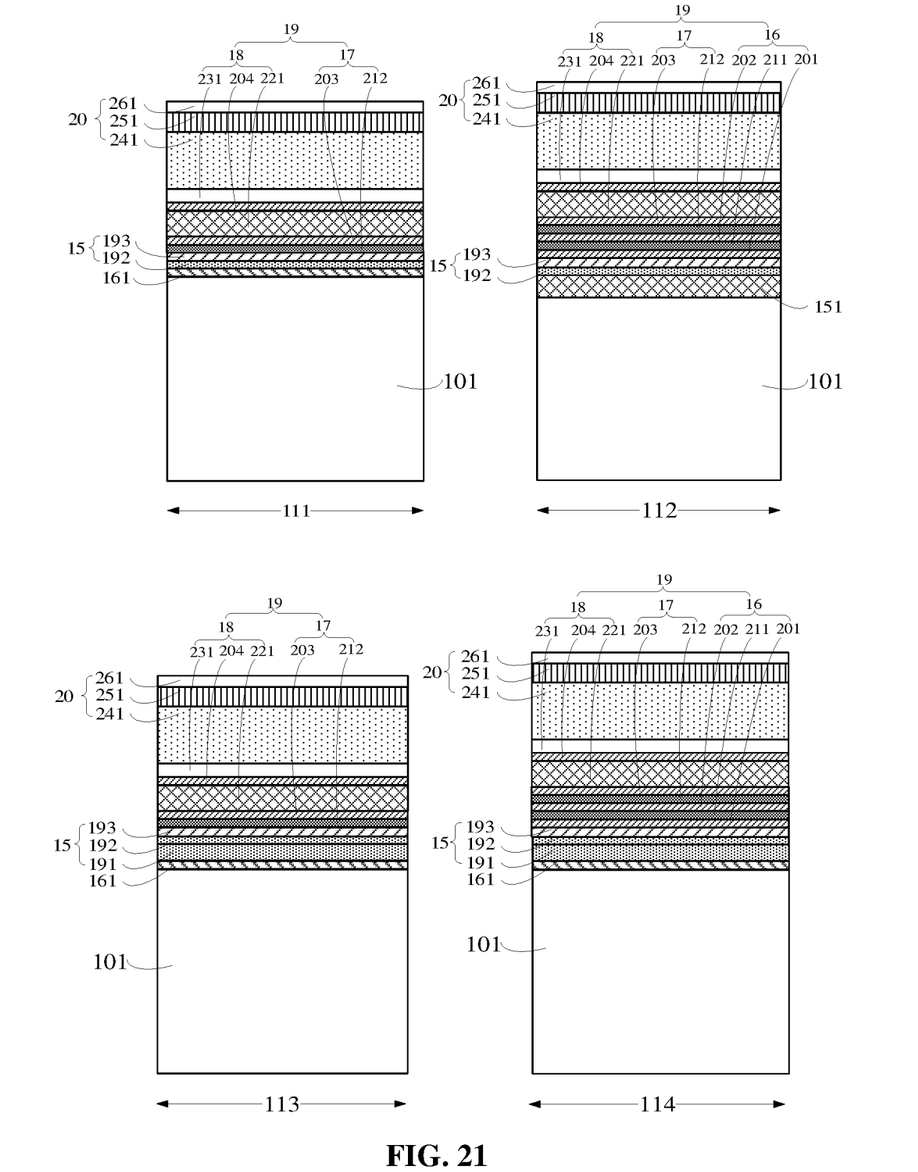

In some embodiments, the gate 19 in the core NMOS area 111 and the peripheral NMOS area 113 includes a second work function layer 17 and a gate electrode layer 18, and the gate 19 in the core PMOS area 112 and the peripheral PMOS area 114 includes a first work function layer 16, a second work function layer 17 and a gate electrode layer 18.

Figure 18:
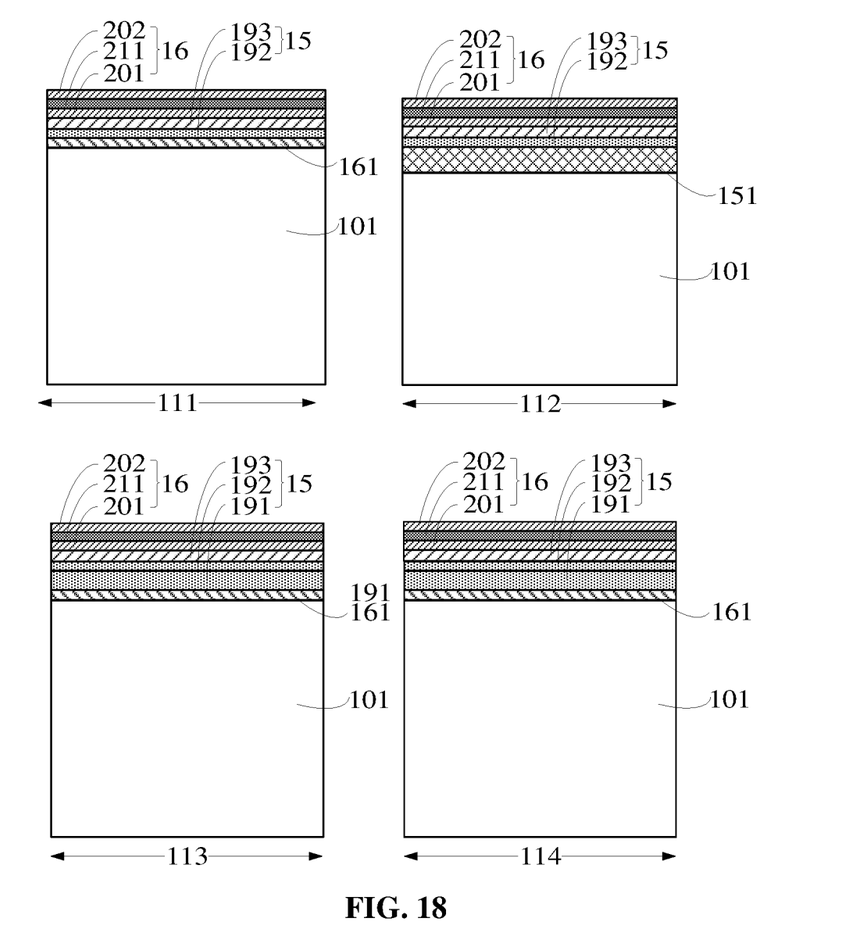

The process step of forming the gate 19 includes the following operation. Referring to FIG. 18, the first work function layer 16 is formed on the gate dielectric layer 15 in the core NMOS area 111, the core PMOS area 112 and the peripheral NMOS area 113.

In some embodiments, a first middle layer 201, a first function adjusting layer 211 and a second middle layer 202 are formed in sequence, and the first middle layer 201, the first function adjusting layer 211 and the second middle layer 202 together constitute the first work function layer 16.

Figure 19:
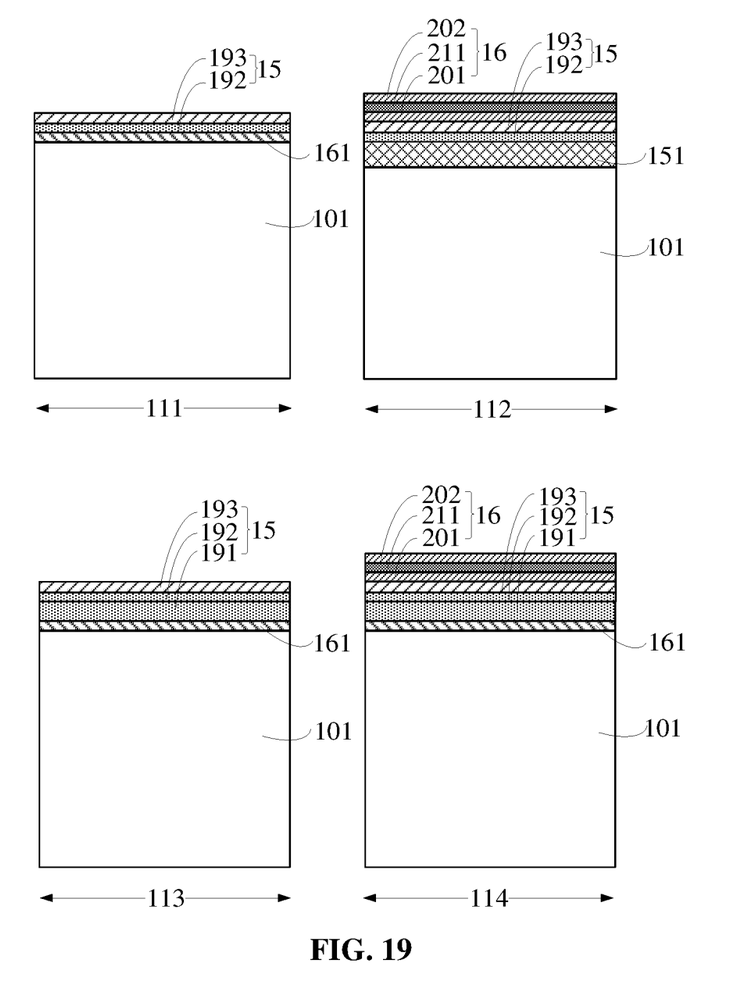

Referring to FIG. 19, the first work function layer 16 in the core NMOS area 111 and the peripheral NMOS area 113 is removed.

Figure 20:
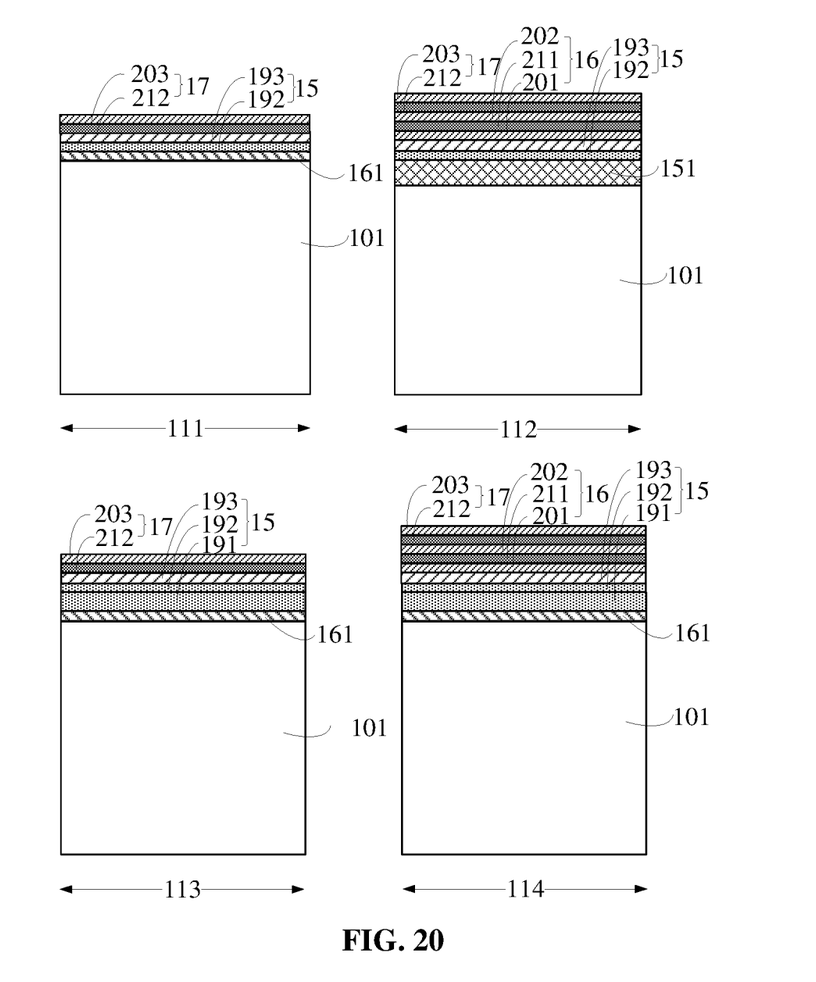

Referring to FIG. 20, a second work function layer 17 is formed on the gate dielectric layer 15 in the core NMOS area 111 and the peripheral NMOS area 113, and the second work function layer 17 is also located on the surface of the first work function layer 16.

In some embodiments, a second function adjusting layer 212 and a third middle layer 203 are formed in sequence. Herein, the second function adjusting layer 212 and the third middle layer 203 cover the third initial gate dielectric layer 193, and the second function adjusting layer 212 and the third middle layer 203 together constitute the second work function layer 17.

In some embodiments, the second function adjusting layer and the third middle layer in the core PMOS area and the peripheral PMOS area may also be removed.

In some other embodiments, the first work function layer may also cover the surface of the second work function layer.

It can be understood that since the functions of the core NMOS area 111 and the core PMOS area 112 are different, the corresponding first work function layer 16 and second work function layer 17 are formed on the surface of each of the core NMOS area 111 and the core PMOS area 112.

Referring to FIG. 21, a gate electrode layer 18 is formed on the second work function layer 17.

In some embodiments, the gate electrode layer 18 may be composed of a polysilicon gate electrode layer 221, a fourth middle layer 204 and a metal gate electrode layer 231 together.

In some embodiments, the material of the fourth middle layer 204 may be the same as the material of the third middle layer 203 and may be titanium nitride, thereby reducing the types of materials in the production processes. The material of the metal gate electrode layer 231 may be metallic tungsten.

The fourth middle layer 204 is used to play a transitional role in the process of migrating the carriers of the polysilicon gate electrode layer 221 to the metal gate electrode layer 231, thereby reducing the possibility of abnormal caused by the direct connection between the polysilicon gate electrode layer 221 and the metal gate electrode layer 231 in the process of migration of the carriers.

In some embodiments, the second work function layer 17 and the gate electrode layer 18 in the core NMOS area 111 and the peripheral NMOS area 113 together constitute the gate 19, and the first work function layer 16, the second work function layer 17 and the gate electrode layer 18 in the core PMOS area 112 and the peripheral PMOS area 114 together constitute the gate 19.

In some embodiments, an isolation layer 20 is also formed on the surface of the gate 19.

In some embodiments, the isolation layer 20 is composed of a first isolation layer 241, a second isolation layer 251 and a third isolation layer 261, and the materials of the first isolation layer 241, the second isolation layer 251 and the third isolation layer 261 are different from each other. The material of the first isolation layer 241 may be silicon nitride, the material of the second isolation layer 251 may be sulfur hydroxide, and the material of the third isolation layer 261 may be silicon oxynitride.

In some embodiments, the isolation layer 20 is used to protect the gate 19. In some other embodiments, the isolation layer 20 is also used to separate adjacent gates 19, so that the gates 19 are not connected to each other.

According to the method for manufacturing a semiconductor structure provided in the embodiments of the disclosure, the height difference between the core NMOS area and the core PMOS area is reduced by oxidizing a part of the substrate in a part of the core PMOS area, thereby facilitating the subsequent production processes. In the embodiments of the disclosure, by forming a second conductive layer on the surface of the substrate in the core NMOS area, the height difference between the core NMOS area and the core PMOS area is further reduced.

The embodiments of the disclosure further provide a semiconductor structure. The semiconductor structure provided in the embodiments of the disclosure will be described below with reference to the accompanying drawings. It should be noted that the parts that are the same as or corresponding to the above method for manufacturing a semiconductor structure may refer to the above corresponding description, and will not be described in detail below.

Referring to FIG. 21, in some embodiments, the semiconductor structure includes: a substrate 101, the substrate 101 including a core NMOS area 111, a core PMOS area 112 and a peripheral NMOS area 113, and in a direction perpendicular to the surface of the substrate 101, a thickness of the substrate 101 in the core PMOS area 112 being less than a thickness of the substrate 101 in the core NMOS area 111; a first semiconductor layer 151 located on the surface of the substrate 101 in the core PMOS area 112, a hole mobility in the first semiconductor layer 151 being greater than a hole mobility in the substrate 101 in the core PMOS area 112; a gate dielectric layer 15 located on the substrate 101 in the core NMOS area 111 and the peripheral NMOS area 113 and on the first semiconductor layer 151 in the core PMOS area 112; and a gate 19 located on the gate dielectric layer 15.

In some embodiments, the top surface of the first semiconductor layer 151 is higher than the surface of the substrate 101 in the core NMOS area 111, so that in the production process, the polishing is stopped when the surface of the first semiconductor layer 151 is exposed in the polishing process so as to avoid the damage to the substrate 101.

In some embodiments, the semiconductor structure further includes: a second semiconductor layer 181. The second semiconductor layer 161 is located on the surface of the substrate 101 in the core NMOS area 111 and the peripheral NMOS area 113, and the material of the second semiconductor layer 161 is the same as the material of the substrate 101.

By providing the second semiconductor layer 161, the height difference between the core NMOS area 111 and the core PMOS area 112 is further reduced, thereby facilitating the subsequent production processes.

In some embodiments, in a direction perpendicular to the surface of the substrate 101, the height difference between the top surface of the first semiconductor layer 151 and the surface of the substrate 101 in the core NMOS area 111 is less than or equal to 10 Å.

By providing a substrate 101 in which a top surface of the substrate in the core PMOS area 112 is lower than the top surface of the substrate 101 in the core NMOS area 111, the height of the top surface of the first semiconductor layer 151 is reduced, so that the height difference between the top surface of the first semiconductor layer 151 and the surface of the substrate 101 in the core NMOS area 111 is less than or equal to 10 Å to facilitate the subsequent production processes.

In some embodiments, the top surface of the first semiconductor layer 151 is higher than the top surface of the second semiconductor layer 161, so that in the production process, the polishing is stopped when the surface of the first semiconductor layer 151 is exposed in the polishing process so as to avoid the damage to the second semiconductor layer 161.

In some embodiments, in a direction perpendicular to the surface of the substrate 101, the height difference between the top surface of the second semiconductor layer 161 and the top surface of the first semiconductor layer 151 is less than or equal to 10 Å.

By adjusting the height of the top surface of the second semiconductor layer 161, the height difference between the core NMOS area 111 and the core PMOS area 112 is reduced, so that the height difference between the top surface of the second semiconductor layer 161 and the top surface of the first semiconductor layer 151 is less than or equal to 10 Å to facilitate the subsequent production processes.

In some embodiments, the semiconductor structure further includes: a peripheral PMOS area 114. The gate dielectric layer 15 is also located on the substrate 101 of the peripheral PMOS area 114. The gate 19 includes: a first work function layer 16 located on the gate dielectric layer 15 in the core PMOS area 112 and the peripheral PMOS area 114; a second work function layer 17 located on the surface of the first work function layer 16 and also located on the substrate 101 in the core NMOS area 111 and the peripheral NMOS area 113; a polysilicon gate electrode layer 221 located on the surface of the second work function layer 17; and a metal gate electrode layer 231 located on the polysilicon gate electrode layer 221.

Specifically, the second initial gate dielectric layer 192 and the third initial gate dielectric layer 193 in the core NMOS area 111 and the core PMOS area 112 together constitute the gate dielectric layer 15 in the core NMOS area 111 and the core PMOS area 112, and the first initial gate dielectric layer 191, the second initial gate dielectric layer 192 and the third initial gate dielectric layer 193 in the peripheral NMOS area 113 and the peripheral PMOS area 114 together constitute the gate dielectric layer 15 in the peripheral NMOS area 113 and the peripheral PMOS area 114.

The second work function layer 17 and the gate electrode layer 18 in the core NMOS area 111 and the peripheral NMOS area 113 together constitute the gate 19, and the first work function layer 16, the second work function layer 17 and the gate electrode layer 18 in the core PMOS area 112 and the peripheral PMOS area 114 together constitute the gate 19.

The first work function layer 16 includes: a first middle layer 201, a first function adjusting layer 211 and a second middle layer 202. The second work function layer 17 includes: a second function adjusting layer 212 and a third middle layer 203. The gate electrode layer 18 includes: a polysilicon gate electrode layer 221, a fourth middle layer 204 and a metal gate electrode layer 231.

In some embodiments, the semiconductor structure further includes an isolation layer 20.

In some embodiments, the isolation layer 20 is composed of a first isolation layer 241, a second isolation layer 251 and a third isolation layer 261.

The embodiments of the disclosure provide a semiconductor structure. By providing the core NMOS area and the core PMOS area with different substrate heights, the height difference between the core NMOS area and the core PMOS area is reduced, and different thicknesses of the second semiconductor layer can be provided according to requirements to further control the height difference between the core NMOS area and the core PMOS area, thereby facilitating the subsequent production processes.

It will be appreciated by those of ordinary skill in the art that the various embodiments described above are specific embodiments for implementing the disclosure and that various changes in form and details may be made in practice without departing from the spirit and scope of the disclosure. Any person skilled in the art can make changes and modifications without departing from the spirit and scope of the disclosure. Therefore, the protection scope of the disclosure shall be subject to the scope defined by the claims.

The invention claimed is:

1. A method for manufacturing a semiconductor structure, comprising:
   providing a substrate comprising a core N-channel Metal Oxide Semiconductor (NMOS) area, a core P-channel Metal Oxide Semiconductor (PMOS) area and a peripheral NMOS area;
   forming a first barrier layer on the surface of the substrate in the core PMOS area;
   performing oxidation treatment on the substrate in the core PMOS area to convert a part of a thickness of the substrate in the core PMOS area into an oxide layer;
   removing the first barrier layer in the core PMOS area and then removing the oxide layer, a thickness of the remaining substrate in the core PMOS area is less than a thickness of the substrate in the core NMOS area;
   forming a first semiconductor layer on the remaining substrate in the core PMOS area, wherein a hole mobility in the first semiconductor layer is greater than a hole mobility in the substrate in the core PMOS area;
   forming a gate dielectric layer located on the first semiconductor layer and on the substrate in the core NMOS area and the peripheral NMOS area; and
   forming a gate on the gate dielectric layer.

2. The method for manufacturing a semiconductor structure of claim 1, wherein in a direction perpendicular to a surface of the substrate, a thickness of the oxide layer ranges from 10 Å to 200 Å.

3. The method for manufacturing a semiconductor structure of claim 1, wherein methods for the oxidation treatment comprise a thermal oxidation method, an in-situ water vapor generation oxidation method or an atomic group oxidation method.

4. The method for manufacturing a semiconductor structure of claim 1, wherein in the process step of forming the first barrier layer, the first barrier layer is also formed on the surface of the substrate in the core NMOS area and the peripheral NMOS area; and
before forming the oxide layer, the method further comprises:
forming a second barrier layer on a surface of the first barrier layer in the core NMOS area and the peripheral NMOS area, wherein the material of the second barrier layer is different from the material of the first barrier layer.

5. The method for manufacturing a semiconductor structure of claim 4, further comprising:
after forming the first semiconductor layer, removing the second barrier layer, and retaining the first barrier layer in the core NMOS area and the peripheral NMOS area.

6. The method for manufacturing a semiconductor structure of claim 1, wherein the substrate further comprises a peripheral PMOS area; and after forming the first semiconductor layer, the method further comprises:
forming a second semiconductor layer on a surface of the substrate in the core NMOS area, the peripheral PMOS area and the peripheral NMOS area by a selective epitaxial process, wherein the material of the second semiconductor layer is the same as the material of the substrate.

7. The method for manufacturing a semiconductor structure of claim 6, further comprising:
before forming the second semiconductor layer, forming a protective layer on a surface of the first semiconductor layer by a chemical oxidation method.

8. The method for manufacturing a semiconductor structure of claim 7, wherein oxidation is performed by using hydrogen peroxide or ozone reagent, and in a direction perpendicular to the surface of the substrate, a thickness of the protective layer is less than or equal to 2 nm.

9. The method for manufacturing a semiconductor structure of claim 1, wherein the first semiconductor layer is formed by a selective epitaxial process; and the material of the first semiconductor layer comprises silicon germanium or germanium.

10. The method for manufacturing a semiconductor structure of claim 9, wherein the material of the first semiconductor layer is silicon germanium, and in the silicon germanium, a mass percentage concentration of germanium element ranges from 5% to 50%.

11. The method for manufacturing a semiconductor structure of claim 1, wherein the process step of forming the gate comprises:
forming a first work function layer on the gate dielectric layer in the core NMOS area, the core PMOS area and the peripheral NMOS area;
removing the first work function layer in the core NMOS area and the peripheral NMOS area;
forming a second work function layer on the gate dielectric layer in the core NMOS area and the peripheral NMOS area, wherein the second work function layer is further located on a surface of the first work function layer; and
forming a gate electrode layer on the second work function layer.

* * * * *